(12) United States Patent
Kavalieros et al.

(10) Patent No.: US 7,470,972 B2
(45) Date of Patent: Dec. 30, 2008

(54) COMPLEMENTARY METAL OXIDE SEMICONDUCTOR INTEGRATED CIRCUIT USING UNIAXIAL COMPRESSIVE STRESS AND BIAXIAL COMPRESSIVE STRESS

(75) Inventors: Jack Kavalieros, Portland, OR (US);
Justin K. Brask, Portland, OR (US);
Mark L. Doczy, Beaverton, OR (US);
Matthew V. Metz, Hillsboro, OR (US);
Suman Datta, Beaverton, OR (US);
Brian S. Doyle, Portland, OR (US);
Robert S. Chau, Beaverton, OR (US);
Everett X. Wang, San Jose, CA (US);
Philippe Matagne, Beaverton, OR (US);
Lucian Shifren, Hillsboro, OR (US);
Been Y. Jin, Lake Oswego, OR (US);
Mark Stettler, Hillsboro, OR (US);
Martin D. Giles, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 34 days.

(21) Appl. No.: 11/078,267

(22) Filed: Mar. 11, 2005

(65) Prior Publication Data
US 2006/0205167 A1 Sep. 14, 2006

(51) Int. Cl.
*H01L 29/20* (2006.01)

(52) U.S. Cl. ........................ 257/615; 257/19; 257/616; 257/382; 257/E29.104; 257/E29.193; 438/933; 438/217; 438/194

(58) Field of Classification Search .................. 257/616, 257/202, 204–205, 250, 197, 191, 192, 19, 257/E29.104, E29.105, 382, 615; 438/936, 438/285, 590, 933, 217, 194, 300
See application file for complete search history.

(56) References Cited

U.S. PATENT DOCUMENTS

| 6,600,170 B1 | 7/2003 | Xiang |
| 7,037,795 B1* | 5/2006 | Barr et al. ................... 438/300 |
| 7,217,949 B2* | 5/2007 | Chan et al. .................... 257/19 |
| 2003/0080361 A1 | 5/2003 | Murthy et al. |
| 2004/0026765 A1 | 2/2004 | Currie et al. |
| 2004/0262683 A1 | 12/2004 | Bohr et al. |
| 2005/0158934 A1* | 7/2005 | Yun et al. .................... 438/197 |

(Continued)

FOREIGN PATENT DOCUMENTS

EP          1 174 928          1/2002

*Primary Examiner*—Phuc T Dang
*Assistant Examiner*—Thanh Y Tran
(74) *Attorney, Agent, or Firm*—Trop, Pruner & Hu, P.C.

(57) ABSTRACT

A transistor may be formed of different layers of silicon germanium, a lowest layer having a graded germanium concentration and upper layers having constant germanium concentrations such that the lowest layer is of the form $Si_{1-x}Ge_x$. The highest layer may be of the form $Si_{1-y}Ge_y$ on the PMOS side. A source and drain may be formed of epitaxial silicon germanium of the form $Si_{1-z}Ge_z$ on the PMOS side. In some embodiments, x is greater than y and z is greater than x in the PMOS device. Thus, a PMOS device may be formed with both uniaxial compressive stress in the channel direction and in-plane biaxial compressive stress. This combination of stress may result in higher mobility and increased device performance in some cases.

7 Claims, 4 Drawing Sheets

U.S. PATENT DOCUMENTS

2005/0184316 A1* 8/2005 Kim et al. .................. 257/213
2006/0046366 A1* 3/2006 Orlowski et al. ............ 438/198
2006/0145264 A1* 7/2006 Chidambarrao et al. ..... 257/369

* cited by examiner

US 7,470,972 B2

COMPLEMENTARY METAL OXIDE SEMICONDUCTOR INTEGRATED CIRCUIT USING UNIAXIAL COMPRESSIVE STRESS AND BIAXIAL COMPRESSIVE STRESS

BACKGROUND

This invention relates generally to the fabrication of integrated circuits.

To increase performance of NMOS and PMOS deep submicron transistors in CMOS technology, current state-of-the-art technology uses compressive stress in the channel of the PMOS transistors, and tensile stress in the case of NMOS transistors. This is usually achieved by substrate induced strain which is a very expensive technology option and is also difficult to implement using a single substrate approach.

DETAILED DESCRIPTION

Figure 1:
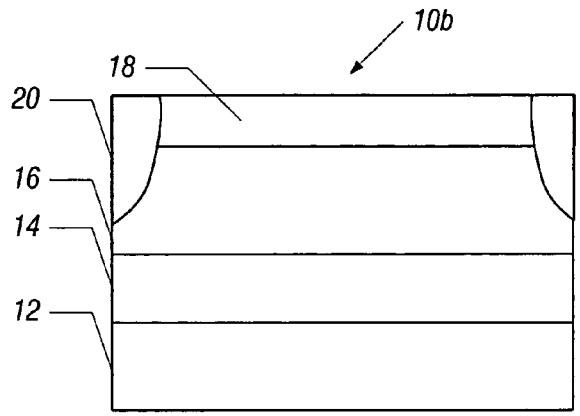
FIG. 1 is an enlarged, cross-sectional view of an NMOS transistor at an early stage of manufacture.

Referring to FIG. 1, a silicon substrate 12 may be covered by a graded buffer layer 14. The buffer layer 14 may be formed of silicon germanium of the formula $Si_{1-x}Ge_x$ where x is from 0.05 to 0.3. In one embodiment, the buffer layer 14 may be epitaxially grown, while gradually increasing the concentration of germanium. Thus, the germanium concentration is highest at the top of the layer 14, lowest at the bottom, and linearly increases from bottom to top in one embodiment.

Over the layer 14 may be deposited a constant concentration silicon germanium buffer layer 16. In one embodiment of the present invention, this layer 16 may have a thickness of from 2000 to 10,000 Angstroms. The layer 16 may have a constant germanium concentration substantially equal to that of the highest germanium level of the layer 14, in one embodiment.

A tensile strained silicon layer 18 is formed thereover. Shallow trench isolations 20 may be provided as well. In one embodiment of the present invention, the structure 10b, shown in FIG. 1, will be utilized to form both NMOS and PMOS transistors of a complementary metal oxide semiconductor integrated circuit technology.

The gradient of germanium in the graded buffer layer 14 can vary depending on the thickness and final germanium concentration. In some embodiments, the concentration of germanium in the graded layer 14 extends from about zero percent at the bottom to about 40 percent at the top. Other percentages may be utilized in different situations. The layer 14 functions to achieve a relaxed silicon germanium layer and to reduce dislocation formation due to mismatch in the lattice constraints between silicon and the silicon germanium. The constant germanium concentration silicon germanium buffer layer 16 further stabilizes the structure.

The tensile strained silicon layer 18 may be grown. The strained nature of the layer 18 is limited by the critical layer thickness associated with the concentration of germanium in the underlying buffer layer 16.

Figure 2:
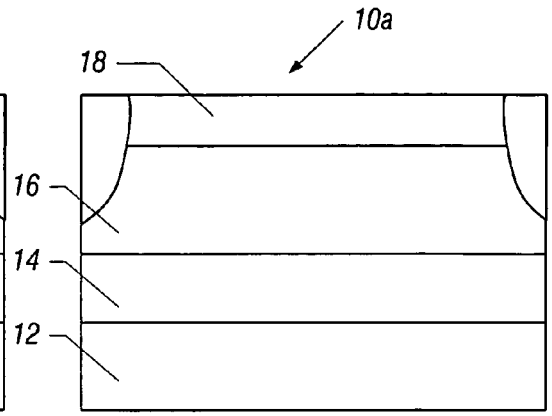
FIG. 2 is an enlarged, cross-sectional view of a PMOS transistor at an early stage of manufacture.

At the same time, the PMOS structure 10a may be fabricated, as shown in FIG. 2. The PMOS structure 10a may initially have the same components as the NMOS structure 10b.

Figure 3:
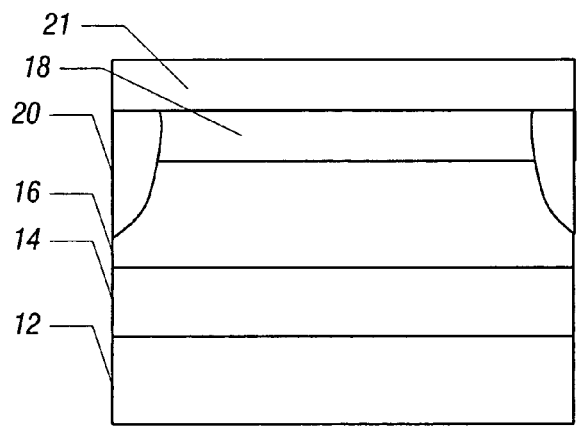
FIG. 3 is an enlarged, cross-sectional view at a stage subsequent to the stage shown in FIG. 1 in accordance with one embodiment of the present invention.

Thereafter, as shown in FIG. 3, a hard mask 21 may be deposited over the tensile strained silicon layer 18 on the NMOS side 10b and PMOS side 10a.

Figure 4:
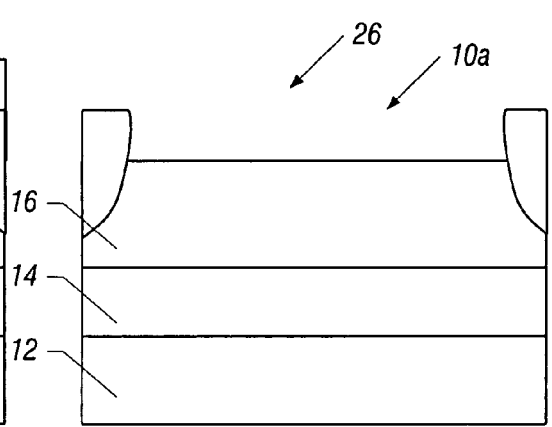
FIG. 4 is an enlarged, cross-sectional view at a stage subsequent to the stage shown in FIG. 2 in accordance with one embodiment of the present invention.

Then, a hard mask etch and resist removal may be utilized to remove the tensile strained silicon 18 and the hard mask 21 on the PMOS transistor structure 10a as shown in FIG. 4. The selective etch may use 5 to 8 percent $NH_4OH$ with a pH between about 10.2 and 10.4 at a temperature between 20° C. and 27° C. in one embodiment. The resulting structure has the tensile strained silicon removed on the PMOS side 10a. The NMOS side 10b is still covered by the hard mask 21 (FIG. 3).

The selective wet etch of the strained silicon layer 18 is such that nucleophillic binding energy of silicon is surpassed and an etch of the silicon layer 18 is effected. However, the nucleophillic binding energy may be only about 0.5 kJ/mol too little to solubilize the germanium to the corresponding aqueous species, so the layer 16 is preserved.

Figure 6:
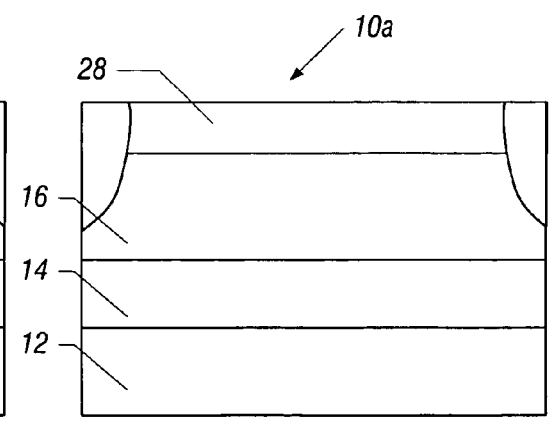
FIG. 6 is an enlarged, cross-sectional view at a stage subsequent to the stage shown in FIG. 4 in accordance with one embodiment of the present invention.
Figure 7:
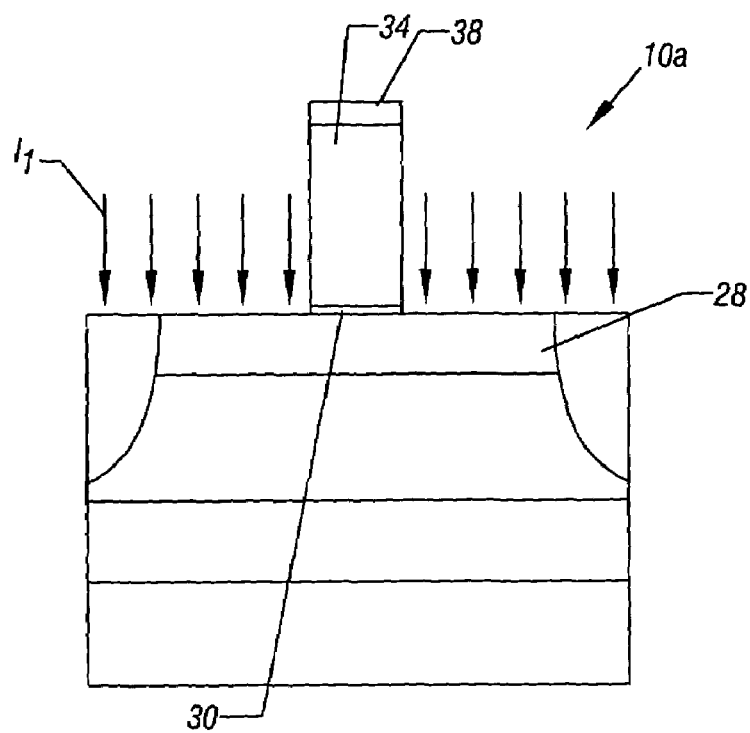
FIG. 7 is an enlarged, cross-sectional view at a stage subsequent to the stage shown in FIG. 6 in accordance with one embodiment of the present invention.

Then, a compressively strained silicon germanium layer 28 is deposited as shown in FIG. 6 on the PMOS side 10a. The silicon germanium may be of the formula $Si_{1-y}Ge_y$, where y is greater than x. The higher concentration y means the layer 28 has a larger lattice than the underlying layers, resulting in compressive strain applied upwardly by the layers 14 and 16 to biaxially compress the layer 28.

Figure 5:
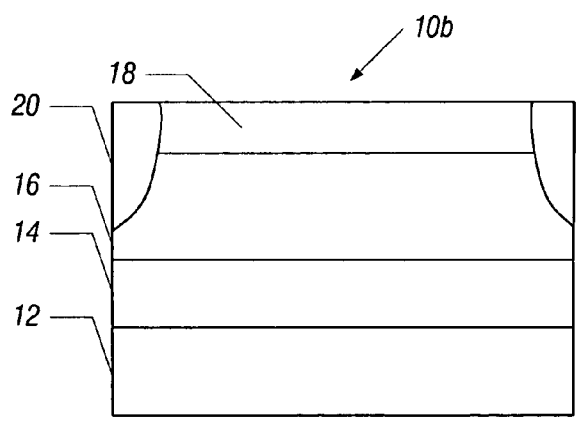
FIG. 5 is an enlarged, cross-sectional view at a stage subsequent to the stage shown in FIG. 3 in accordance with one embodiment of the present invention.

The layer 28 may be selectively grown on the PMOS side 10a only and not on the NMOS side 10b as indicated in FIG. 5 because only the NMOS side 10b was covered by the hard mask 21 at the time the layer 28 was deposited.

The fabrication of the PMOS transistor proceeds as shown in FIGS. 7-11. On both the NMOS and PMOS sides a silicon dioxide gate oxide 30 may be deposited in one embodiment. The gate oxide 30 may be covered by a gate material 34, such as polysilcon, in turn covered by a hard mask 34 for patterning. Then the gate material 34 and gate oxide 30 are patterned to generate the FIG. 7 structure on the PMOS side 10a (and the same structure is created on the NMOS side 10b with the layer 18 replacing the layer 28).

Figure 8:
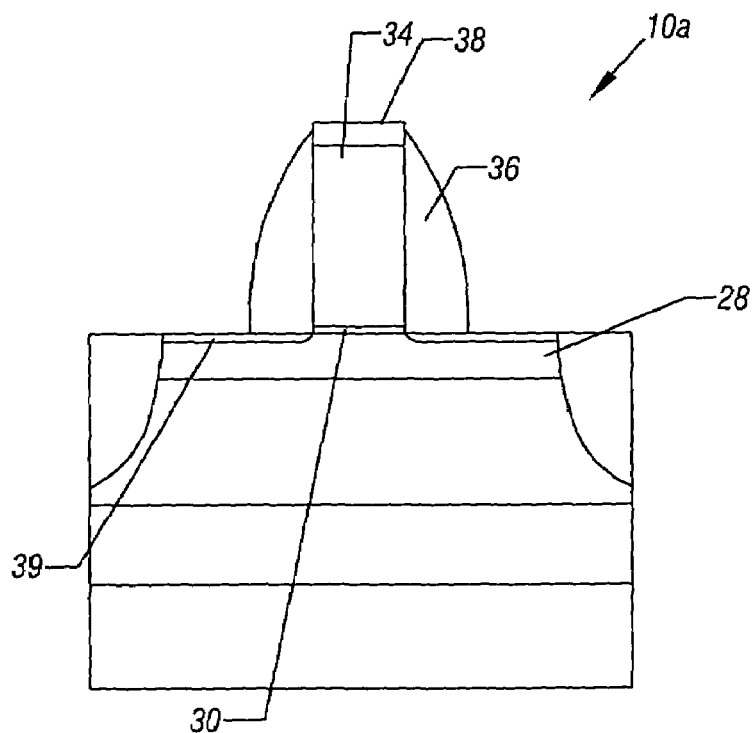
FIG. 8 is an enlarged, cross-sectional view at a stage subsequent to the stage shown in FIG. 7 in accordance with one embodiment of the present invention.

Then, separate tip implants I (FIG. 7) and standard lithographic patterning form the lightly doped source drain regions 39 on both NMOS and PMOS sides (FIG. 8). A nitride spacer material may be deposited and anisotropically etched on both NMOS and PMOS sides to form the spacers 36.

Figure 9:
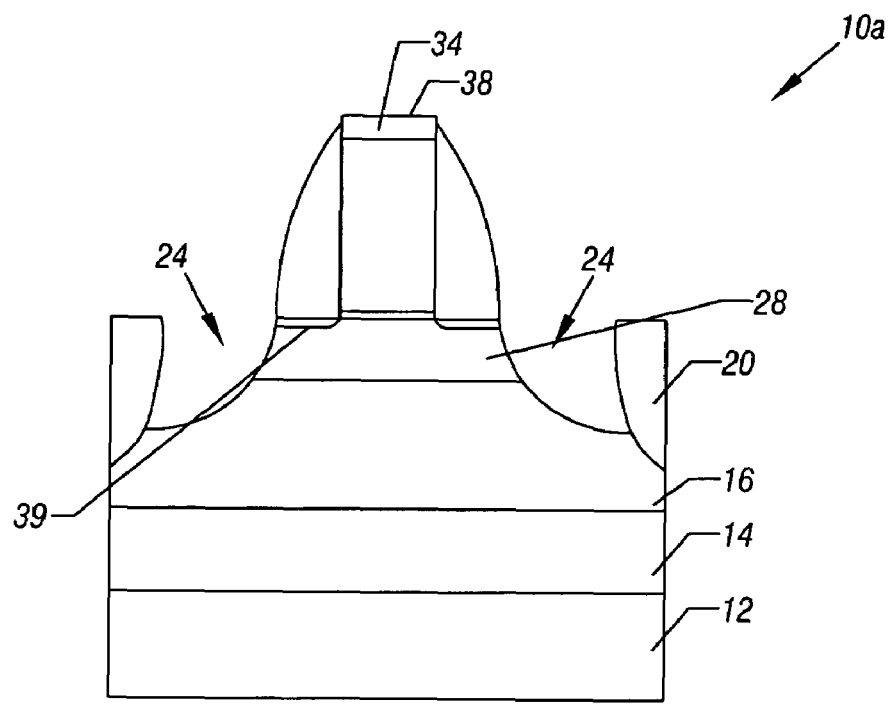
FIG. 9 is an enlarged, cross-sectional view at a stage subsequent to the stage shown in FIG. 8 in accordance with one embodiment of the present invention.

On the PMOS side 10a only, a trench 24 is formed through the layer 28 and into the layer 16, as shown in FIG. 9. The trench 24 may be formed by reactive ion etching using $SF_6$ chemistry. The etching is constrained by the isolation 20 on one side and may isotropically undercut the gate structure on the other side. As a result, an isotropic etch profile may be achieved on the inward edges of the trench 24 as shown in FIG. 9. During this step the NMOS side 10a may be covered by an oxide mask (not shown).

Figure 10:
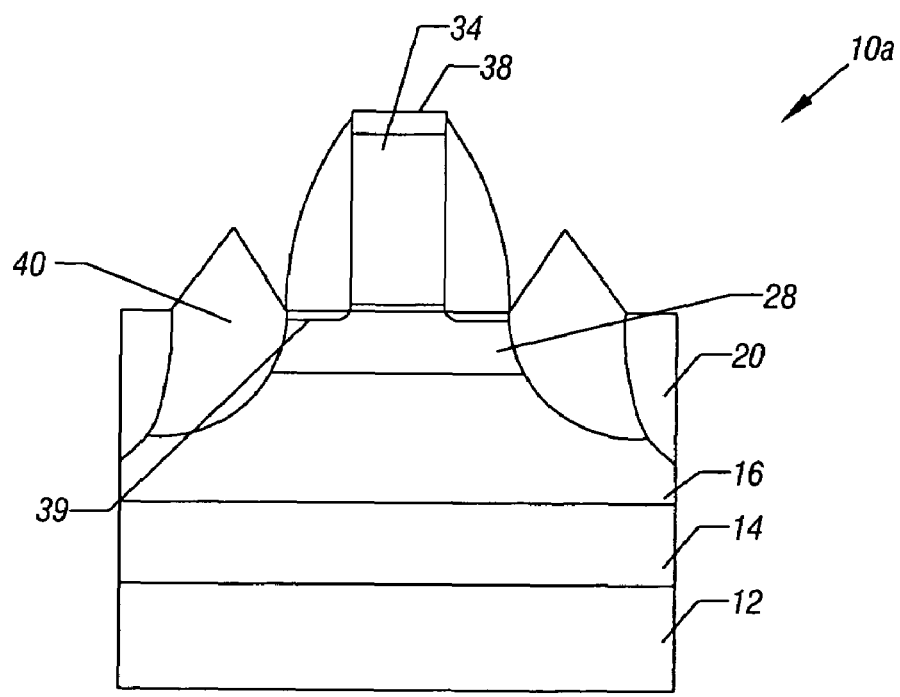
FIG. 10 is an enlarged, cross-sectional view at a stage subsequent to the stage shown in FIG. 9 in accordance with one embodiment of the present invention.

Then, an epitaxial silicon germanium source drain 40 may be grown which fills the trench 24 and extends thereabove as indicated at FIG. 10. The trench 24 may be filled using silicon germanium having 10-40 atomic percent germanium. Source drain doping may be done by insitu doping using a diborane source. The epitaxial source drain 40 only grows in the trench 24 because all other material is masked or covered. The source drain 40 is raised and continues to grow until the facets meet.

Figure 11:
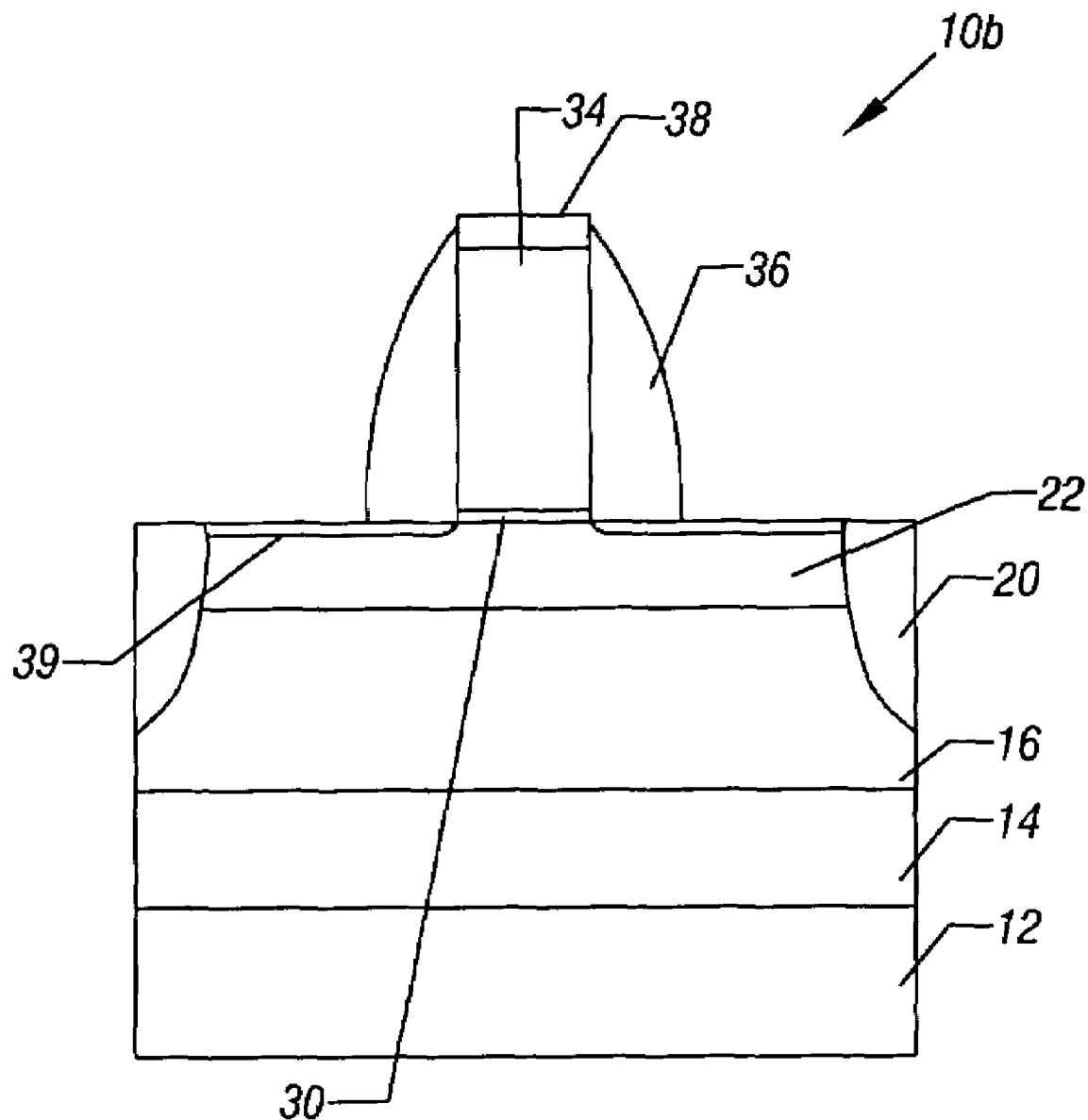
FIG. 11 is an enlarged, cross-sectional view at a stage subsequent to the stage shown in FIG. 5 in accordance with one embodiment of the present invention.

The fabrication of the NMOS transistor 10b, shown in FIG. 11, proceeds correspondingly. However, a conventionally non-epitaxially grown deeper source drain (not shown) may be created.

The PMOS device 10a may have both uniaxial compressive stress in the channel direction and in-plane biaxial compressive stress. The $Si_{1-y}Ge_y$ layer 28 acts as a channel and is grown on a relaxed $Si_{1-x}Ge_x$ buffer layer 16 with x less than y to produce in-plane biaxial compressive stress. In addition, a silicon germanium epitaxial source drain 40 produces uniaxial compressive stress in the channel <110> crystallographic direction. The source drain 40 has a higher germanium concentration than the layer 14 so the source drain 40 pushes inwardly from the sides compressing layer 28. With this combination of stress, higher mobility and, thus, higher device performance may be achieved compared to using either of the stresses alone in some embodiments.

Once the optimal stress condition is known, the device may be engineered to produce such stress through an epitaxial silicon germanium source drain 40 and a silicon germanium layered structure. Then, a graded silicon germanium buffer layer 14 may be grown on the silicon substrate 12 followed by a relaxed $Si_{1-x}Ge_x$ layer 16 as shown in FIG. 10. Then, a thin $Si_{1-y}Ge_y$ layer 28 is grown to form a biaxial compressive strained channel.

The uniaxial stress is produced by the epitaxial source drain process using epitaxial $Si_{1-z}Ge_z$ grown in recessed source drain regions 40. Selecting the germanium fractions so that x is less than y and z is less than x achieves the desired compressive states.

The mobility gain may remain high even as vertical field (gate field) is applied in some embodiments. In addition, more head room may be provided to increase performance before the device hits the physical stress limit in some embodiments. With the provision of combined stress, holes may stay in their lowest transport effective mass in the <110> channel direction where scattering suppression is also the strongest. Silicon band structure has a minimum at the gamma point. It also has twelve wings in (0, +−1, +−1), (+−1, 0, +−1) and (+−1, +−1, 0) directions. Ideally, almost all of the holes are placed in two wings in the (1, −1, 0) and (−1, 1, 0) direction to achieve the lowest possible transport effective mass in the channel direction. This can be achieved by applying both uniaxial compressive and biaxial compressive stress.

The biaxial compressive stress lowers the energy level of the four in-plane wings and removes holes from the eight off plane wings, placing them in the four in-plane wings. The four in-plane wings not only have smaller effective mass, but also have smaller density states, which leads to a reduction of scattering. The greatest mobility enhancement happens when the uniaxial compressive stress along the channel direction is added to the biaxial compressed device.

According to simulation, when hole-optical phonon and surface roughness scattering occurs, most of the holes stay only in the wings along (1, −1, 0) and (−1, 1, 0), which has the smallest transport effective mass in the channel direction. Since only two wings are occupied, the density of states is also greatly reduced, enhancing scattering suppression. As a result, the combination stressed device may have higher mobility.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A semiconductor structure comprising:
   a substrate;
   a gate electrode over said substrate;
   a channel under said gate electrode having uni-axial compressive stress and in-plane biaxial compressive stress, including a first layer under said gate electrode of $Si_{1-y}Ge_y$ and a second layer under said first layer, said second layer having $Si_{1-x}Ge_x$ where x and y are not one or zero, and x is less than y; and
   an epitaxial source drain of $Si_{1-z}Ge_z$ where z is not one or zero.

2. The structure of claim 1 wherein z is greater than x.

3. The structure of claim 1 wherein said second layer has a graded germanium concentration.

4. The structure of claim 3 wherein said graded germanium concentration increases as it extends towards the gate electrode.

5. The structure of claim 1 including a third layer between said first and second layers.

6. The structure of claim 5 wherein said third layer has a relatively constant concentration germanium.

7. The structure of claim 6 wherein said third layer includes a concentration of germanium approximately equal to the maximum concentration of germanium in said second layer.

* * * * *